(12) United States Patent
Zeidler et al.

(10) Patent No.: US 9,263,233 B2
(45) Date of Patent: Feb. 16, 2016

(54) CHARGED PARTICLE MULTI-BEAM INSPECTION SYSTEM AND METHOD OF OPERATING THE SAME

(71) Applicants: Carl Zeiss Microscopy GmbH, Jena (DE); Applied Materials Israel, Ltd., Rehovot (IL)

(72) Inventors: Dirk Zeidler, Oberkochen (DE); Rainer Knippelmeyer, Utting am Ammersee (DE); Thomas Kemen, Aalen (DE); Mario Muetzel, Oberkochen (DE); Stefan Schubert, Oberkochen (DE); Nissim Elmaliah, Raanana (IL); Steven Rogers, D.N. Emek Sorek (IL)

(73) Assignees: CARL ZEISS MICROSCOPY GMBH, Jena (DE); APPLIED MATERIALS ISRAEL, LTD., Rehvot (IL)

( * ) Notice: Subject to any disclaimer, the term of this patent is extended or adjusted under 35 U.S.C. 154(b) by 0 days.

(21) Appl. No.: 14/499,228

(22) Filed: Sep. 28, 2014

(65) Prior Publication Data
US 2015/0090879 A1 Apr. 2, 2015

Related U.S. Application Data

(60) Provisional application No. 61/884,096, filed on Sep. 29, 2013.

(51) Int. Cl.
*H01J 37/28* (2006.01)
(52) U.S. Cl.
CPC ......... *H01J 37/28* (2013.01); *H01J 2237/0453* (2013.01); *H01J 2237/24592* (2013.01)

(58) Field of Classification Search
USPC .......................................... 250/306, 310, 397
See application file for complete search history.

(56) References Cited

U.S. PATENT DOCUMENTS

| 5,892,224 A | 4/1999 | Nakasuji |
| 2005/0006563 A1* | 1/2005 | Baselmans .......... G03F 7/70291 250/208.1 |
| 2006/0289804 A1 | 12/2006 | Knippelmeyer et al. |

(Continued)

FOREIGN PATENT DOCUMENTS

| WO | 2005024881 A2 | 3/2005 |
| WO | 2007028595 A2 | 3/2007 |

(Continued)

*Primary Examiner* — Kiet T Nguyen
(74) *Attorney, Agent, or Firm* — Morris & Kamlay LLP (57) ABSTRACT

A charged particle multi-beam inspection system comprises a beam generator directing a plurality of primary charged particle beams onto an object to produce an array of beam spots; an array of a first number of detection elements generating detection signals upon incidence of electrons; imaging optics imaging the array of beam spots onto the array of detection elements; wherein the beam generator includes a multi-aperture plate having an array of a second number of apertures greater than the first number; wherein the beam generator includes a selector having plural different states, wherein, in each of the plural different states, the apertures of a different group of apertures are each traversed by one primary charged particle beam, wherein a number of the apertures of the different group of apertures is equal to the first number.

5 Claims, 7 Drawing Sheets

(56) References Cited

U.S. PATENT DOCUMENTS

| | | |
|---|---|---|
| 2009/0114818 A1 | 5/2009 | Casares et al. |
| 2009/0159810 A1 | 6/2009 | Knippelmeyer et al. |
| 2009/0256075 A1 | 10/2009 | Kemen et al. |
| 2010/0320382 A1 | 12/2010 | Almogy et al. |
| 2013/0032729 A1 | 2/2013 | Knippelmeyer |
| 2013/0187046 A1 | 7/2013 | Zeidler et al. |
| 2014/0197322 A1 | 7/2014 | Eder et al. |
| 2014/0224985 A1 | 8/2014 | Rodgers et al. |

FOREIGN PATENT DOCUMENTS

| | | |
|---|---|---|
| WO | 2007028596 A1 | 3/2007 |
| WO | 2007060017 A2 | 5/2007 |
| WO | 2008101714 A2 | 8/2008 |
| WO | 2011124352 A1 | 10/2011 |
| WO | 2012041464 A1 | 4/2012 |
| WO | 2012112894 A2 | 8/2012 |
| WO | 2012151288 A1 | 11/2012 |
| WO | 2013032949 A1 | 3/2013 |

* cited by examiner


CHARGED PARTICLE MULTI-BEAM INSPECTION SYSTEM AND METHOD OF OPERATING THE SAME

CROSS-REFERENCES TO RELATED APPLICATIONS

The present application claims priority of Provisional Patent Application No. 61/884,096, filed Sep. 29, 2013 in the United States of America, the entire contents of which are incorporated by reference herein.

FIELD

The present disclosure relates to charged particle multi-beam inspection systems and methods of operating charged particle multi-beam inspection systems in which a plurality of particle beams are directed onto an object.

BACKGROUND

A conventional charged particle beam inspection system in which a plurality of particle beams is directed onto an object is known from WO 2005/024881. The system is an electron microscope in which a plurality of primary electron beams are focused in parallel to form an array of primary electron beam spots on the object. Electrons generated by the primary electrons and emanating from respective primary electron beam spots are received by a charged particle imaging optics to form a corresponding array of electron beams which are supplied to an electron detection system having an array of detection elements such that each electron beam is incident on a separate detection element. Detection signals generated from the detection elements are indicative of properties of the object at those locations where the primary electron beam spots are formed.

By scanning the array of primary electron beam spots across the object, it is possible to obtain an electron microscopic image of the object. It is desirable to obtain images at a high resolution, uniform resolution and a high throughput.

SUMMARY

The present invention has been accomplished taking the above problems into consideration.

Embodiments of the present invention provide charged particle multi-beam inspection systems and methods of operating charged particle multi-beam inspection systems which can improve resolutions and throughputs in which a quality of the multiple beams directed onto the object is not a same quality for all beams and, in particular, where one or more beams have a deficiency or do not even reach the object.

Some embodiments provide a charged particle multi-beam inspection system, comprising: a beam generator configured to generate a plurality of primary charged particle beams and to direct the plurality of primary charged particle beams onto an object plane such that an array of beam spots is produced on the object plane; an array of a first number of detection elements configured to generate detection signals upon incidence of electrons on the detection elements; charged particle imaging optics configured to image the array of beam spots onto the array of detection elements such that electrons generated by the primary charged particle beams at each beam spot are directed onto a corresponding detection element; wherein the beam generator includes a multi-aperture plate having an array of a second number of apertures; wherein the second number is greater than the first number; wherein the beam generator is configured such that the apertures of a group apertures are each traversed by one primary charged particle beam producing a beam spot which is imaged onto one of the detection elements, wherein a number of the apertures of the group of apertures is equal to the first number; wherein the beam generator includes a selector having plural different states, wherein, in each of the plural different states, the apertures of a different group of apertures are each traversed by one primary charged particle beam producing a beam spot which is imaged onto one of the detection elements, wherein a number of the apertures of the different group of apertures is equal to the first number.

The multi-aperture plate of the beam generator may have a function of a beam divider which produces the plurality of primary charged particle beams from one single beam having a large diameter which is incident on the multi-aperture plate, wherein particles of the incident beam traversing individual apertures provided in the multi-aperture plate form the plurality of small diameter primary charged particle beams downstream of the multi-aperture plate.

Further, the multi-aperture plate may have a function of providing an array of lenses for the plurality of primary charged particle beams, wherein each charged particle beam traverses one lens and wherein each lens is provided by an aperture of the multi-aperture plate.

Moreover, the multi-aperture plate may also provide both functions of the beam divider and the lens array. Still further, plural multi-aperture plates can be provided in the beam path of the primary charged particle beams, wherein the apertures of the plural multi-aperture plates are aligned such that each beam traverses apertures of the plural multi-aperture plates.

The second number of the apertures of the multi-aperture plate is greater than the first number of detection elements configured to generate detection signals upon incidence of electrons. Therefore, only a portion of the second number of apertures of the multi-aperture plate are traversed by primary charged particle beams which produce electrons at beam spots which are finally imaged onto detection elements.

The selector is configured to select the portion, or groups, of apertures which are traversed by primary charged particle beams producing beam spots imaged onto the detection elements from the total number of apertures. In each of plural different states of the selector, a different group of apertures is used for generating the detection signals, accordingly.

Therefore, when the system is operated with the selector set to a first state in which the apertures of a first group of apertures are traversed by primary charged particle beams producing beam spots imaged onto the detection element, and it is determined that at least one aperture of the apertures of the first group of apertures has a deficiency, the selector can be set to a second state in which the apertures of a different second group of apertures are traversed by primary charged particle beams producing beam spots imaged onto the detection elements. The second group can be selected such that the aperture having the deficiency is not a member of the second group. Moreover, the second group can be selected such that the aperture having the deficiency is at a position within the second group at which it is less disturbing than in the first group. This can be achieved, for example, when the aperture having the deficiency is located at an edge or a corner of the second group.

According to some embodiments, the second number of apertures is greater than or equal to two times the first number of detection elements, or the second number is greater than or equal to four times the first number.

According to some embodiments, the selector comprises a first actuator configured to laterally displace the multi-aperture plate between plural different positions such that, in each of the plural different states, the multi-aperture plate is in a different position.

According to some other embodiments, the selector comprises a charged particle beam deflector and a controller to energize the charged particle beam deflector and to adjust plural different deflection amounts provided by the charged particle beam deflector such that, in each of the plural different states, a different deflection amount is adjusted. The selector may further comprise a plate having an aperture traversed by the particles of all beams directed onto the object, and wherein a second actuator is configured to laterally displace the plate between plural different positions. The plate may have a function of intercepting primary charged particle beams which would, when not intercepted, generate a beam spot on the object which is not imaged onto a detection element. The plate may further have a function of an electrode located opposite to the multi-aperture plate, wherein the electrode can be positioned as necessary relative to the group of apertures used for producing beam spots imaged onto detection elements.

Further embodiments provide scanning strategies used in charged particle multi-beam inspection systems for scanning a plurality of primary charged particle beam spots across an object for collecting electron intensities providing information on the inspected object.

According to some embodiments, a method of operating a charged particle multi-beam inspection system comprises: directing a plurality of primary charged particle beams onto an object such that an array of beam spots is produced on the object, wherein the array of beam spots can be displaced relative to the object; a first recording operation including maintaining each beam spot of the array of beam spots at a respective location of the object for a predetermined duration and detecting electrons originating from the beam spots; a first advance operation including displacing the array of beam spots relative to the object from an initial position to a next position such that the next position is displaced from the initial position by a first distance; a second advance operation including displacing the array of beam spots relative to the object from an initial position to a next position such that the next position is displaced from the initial position by a second distance which is greater than the first distance; a second recording operation including repeatedly performing a sequence of the first recording operation and the first advance operation such that each beam spot is maintained at each of plural different locations on the object for the predetermined duration; and a third recording operation including repeatedly performing a sequence of the second recording operation and the second advance operation such that plural different beam spots are maintained at each of the plural different locations on the object for the predetermined duration.

Different primary charged particle beams are directed to each of the plural different locations on the object at which electrons are detected. In some embodiments, each of the plurality of the primary charged particle beams is directed at least once to each of the plural different locations on the object from which electrons are detected.

If it is determined that one or more of the primary charged particle beams has a deficiency, the detection of electrons produced by the deficient beam can be ignored when the detection events caused by the various beams are compiled to a total electron amount associated with each of the plural different locations on the object.

Moreover, if the plural primary charged particle beams differ with respect to their beam intensities or focusing properties, these differences can be averaged out since each of the plural different locations on the object receives different beams.

According to some embodiments, the method further comprises accumulating the detected electron intensities originating from the beam spots maintained at a given location for each given location of the different locations on the object. Such accumulation allows to determine an average electron intensity produced by the different beams at each location on the object. According to some embodiments herein, the method further comprises determining a deficiency of at least one primary charged particle beam and excluding detected electron intensities originating from the beam spot produced by the primary charged particle beam having the deficiency from the accumulation. This may result in a more uniform resolution since resolution differences between beams are averaged out and deficient beams do not contribute to the acquired data. This can be of particular advantage if a stitching technique is used to combine data acquired from plural adjacent regions of an object to produce data related to a greater portion of the object or if three-dimensional images of an object are acquired by combining data from plural slices of the object at different heights (z-stacks).

In the first and second advance operations, the array of beam spots is displaced relative to the object from an initial position to a next position such that the next position is displaced from the initial position by a certain distance. This does not require that the array of beam spots is directly displaced from the initial position to the next position, and it is possible that one or more intermediate displacements of the array of beam spots are performed before the next position is reached. In particular, a plurality of first advance operations can be performed after the array of beam spots is positioned in the initial position of the second advance operation and before the array of beam spots is positioned in the next position of the second advance operation.

According to some embodiments herein, the second distance is an integer multiple of the first distance.

According to some embodiments, the displacing of the array of beam spots relative to the object includes at least one of deflecting the plurality of primary charged particle beams and displacing the object relative to a source of the primary charged particle beams. In particular, the object can be continuously displaced relative to the source of the primary charged particle beams during the second recording operation.

According to further embodiments, a method of operating a charged particle multi-beam inspection system comprises: directing a plurality of primary charged particle beams onto an object such that a array of beam spots is produced on the object, wherein the array of beam spots can be displaced relative to the object, wherein each charged particle beam is focused near the object, and wherein focus positions of the beams can be collectively changed in the direction of the beams; a first recording operation including maintaining each beam spot of the array of beam spots at a respective location of the object for a predetermined duration and detecting electrons originating from the beam spots; a first advance operation including displacing the array of beam spots relative to the object from an initial position to a next position such that the next position is displaced from the initial position by a first distance; a second recording operation including repeatedly performing a sequence of the first recording operation and the first advance operation such that each beam spot is maintained at each of plural different locations on the object for the predetermined duration; a third recording operation including repeatedly performing a sequence of the second recording operation and collectively changing the focus positions of the beams, such that each beam spot is repeatedly maintained at a given location on the object for the predetermined duration.

In this method, each given location on the object from which electrons are detected, receives at least one primary charged particle beam plural times, wherein the focus position of this beam is changed each time. This allows to perform an averaging of the detected electron intensities associated with the given location for different focusing states. This may have an advantage in charged particle multi-beam inspection systems where the focus positions of the plural primary charged particle beams are not perfectly arranged in a plane orthogonal to the beam directions. It is, for example, only possible that a portion of the primary charged particle beams can be focused exactly on the object, whereas some other beams are focused upstream of the object and some other beams are focused downstream of the object. This results in that different beams produce beam spots of different sizes on the object. Thus, it is not possible to achieve the smallest possible beam spot size simultaneously for all primary charged particle beams, and it is known that the beam spot size determines the resolution of the system. In such situations, it is advantageous to vary the focus positions of the beams and the resulting beam spot sizes such that all beams produce, in effect, slightly increased beam spot sizes which are, however, substantially the same for all primary charged particle beams. This can be of particular advantage if a stitching technique is used to combine data acquired from plural adjacent regions of an object to produce data related to a greater portion of the object or if three-dimensional images of an object are acquired by combining data from plural slices of the object at different heights (z-stacks).

According to some embodiments, the array of beam spots is displaced to a next position in a second advance operation after each given location on the object has repeatedly received a same primary charged particle beam.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

Figure 1:
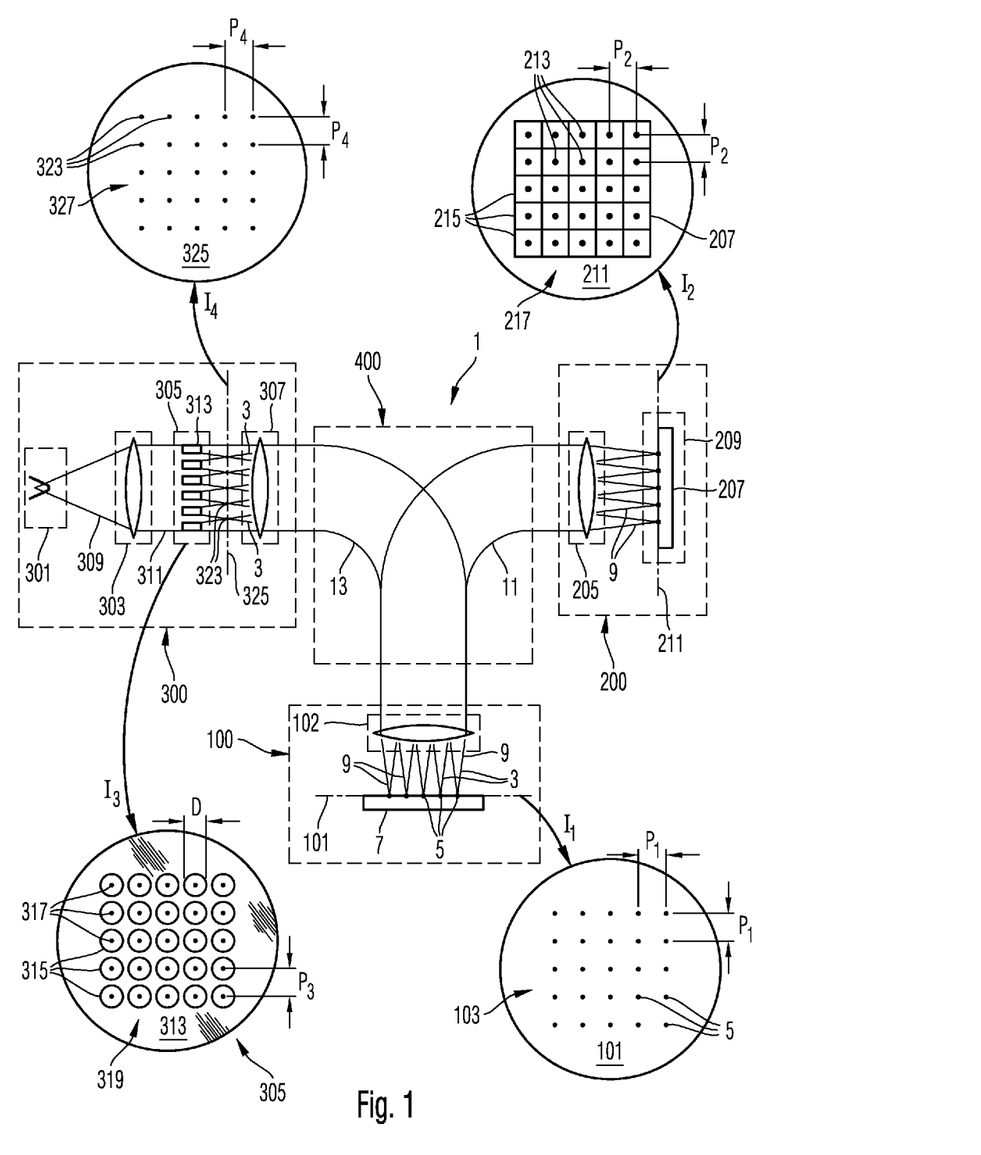
FIG. 1 schematically illustrates basic features and functions of a charged particle multi-beam inspection system.

FIG. 1 is a schematic diagram symbolically illustrating basic functions and features of an inspection system using a plurality of particle beamlets. The inspection system generates a plurality of primary electron beams which are incident on a substrate to be inspected to produce electrons emanating from the substrate which are subsequently detected. The inspection system 1 is of a scanning electron microscope type (SEM) using a plurality of primary electron beams 3 for producing primary electron beam spots 5 on the substrate 7 to be inspected. The inspected substrate 7 can be of any type and may comprise, for example, a semiconductor wafer, a biological sample and an arrangement of miniaturized features of other types. The substrate 7 is arranged in an object plane 101 of an objective lens 102 of an objective lens system 100.

Insert $I_1$ of FIG. 1 shows an elevational view of the object plane 101 with a rectangular array 103 of primary electron beam spots 5 formed thereon. In FIG. 1 a number of 25 primary electron beam spots are arranged as a 5×5-array 103. This number of 25 primary electron beam spots is a low number chosen for ease of illustration in the schematic diagram of FIG. 1. In practice, the number of primary electron beam spots may be chosen substantially higher, such as 20×30, 100×100 and others.

In the illustrated embodiment, the array 103 of primary electron beam spots 5 is a substantially regular rectangular array with a substantially constant pitch $p_1$ between adjacent beam spots. Exemplary values of $p_1$ are 1 μm, 10 μm and 50 μm. It is however also possible that the array 103 has other symmetries, such as a hexagonal symmetry.

A diameter of the primary electron beam spots formed in the object plane 101 can be small. Exemplary values of such diameter are 1 nm, 100 nm and 200 nm. The focusing of the primary electron beams 3 to form the primary electron beam spots 5 is performed by the objective lens system 100.

The primary electrons incident on the substrate 7 at the beam spots 5 produce electrons emanating from the substrate 7. The electrons emanating from the substrate 7 are received by the objective lens 102 to form electron beams 9. The inspection system 1 provides an electron beam path 11 for supplying the plurality of electron beams 9 to a charged particle detection system 200. The detection system 200 comprises a projection lens arrangement 205 for directing the electron beamlets 9 towards a detector 207. The detector is a detector having plural detection elements and may comprise a CCD detector, a CMOS detector, a scintillator detector, a micro-channel plate, an array of PIN-diodes and others and suitable combinations thereof.

Insert $I_2$ of FIG. 1 shows an elevational view of the detector 207, wherein electron beam spots 213 are formed on individual detection elements 215 which are arranged as an array 217 having a pitch $p_2$. Exemplary values of the pitch $p_2$ are 10 μm, 100 μm and 200 μm.

The primary electron beams 3 are generated by a beam generator 300 comprising at least one electron source 301, at least one collimating lens 303, a multi-aperture plate arrangement 305 and a field lens 307.

The electron source 301 generates a diverging electron beam 309 which is collimated by collimating lens 303 to form a beam 311 illuminating the multi-aperture arrangement 305.

Insert $I_3$ of FIG. 1 shows an elevational view of the multi-aperture arrangement 305. The multi-aperture arrangement 305 comprises a multi-aperture plate 313 having a plurality of apertures 315 formed therein. Centers 317 of the apertures 315 are arranged in a pattern 319 corresponding to the pattern 103 of the primary electron beam spots 5 formed in the object plane 101. A pitch $p_3$ of array 103 may have exemplary values of 5 µm, 100 µm and 200 µm. Diameters D of the apertures 315 are less than the pitch $p_3$. Exemplary values of the diameters D are $0.2 \cdot p_3$, $0.4 \cdot p_3$ and $0.8 \cdot p_3$.

Electrons of the illuminating beam 311 traversing the apertures 315 form the primary electron beams 3. Electrons of illuminating beam 311 impinging on the plate 313 are intercepted by the plate and do not contribute to forming the primary electron beams 3.

Moreover, the multi-aperture arrangement 305 focuses the individual electron beams 3 such that foci 323 are generated in a plane 325. Insert $I_4$ of FIG. 1 shows an elevational view of plane 325 with foci 323 arranged in a pattern 327. A pitch $p_4$ of pattern 327 may be equal to or different from the pitch $p_3$ of pattern 319 of the multi-aperture plate 313. A diameter of the foci 323 may have exemplary values of 10 nm, 100 nm and 1 µm.

The field lens 307 and the objective lens 102 provide an imaging system for imaging the plane 325 with the foci 323 onto the object plane 101 to form the array 103 of primary electron beam spots 5 on the substrate 7.

A beam splitter system 400 is provided in the primary electron beam path 313 in-between the beam generator 300 and the objective lens system 100. The beam splitter system 400 is also part of the electron beam path 11 such that the beam splitter system 400 is located in-between the objective lens system 100 and the detection system 200.

Background information relating to such beamlet inspection system and charged particle components used therein, such as charged particle sources, multi-aperture plates and lenses may be obtained from WO 2005/024881, WO 2007/028595, WO 2007/028596 and WO 2007/060017 wherein the full disclosure of these applications is incorporated herein by reference.

Figure 2:
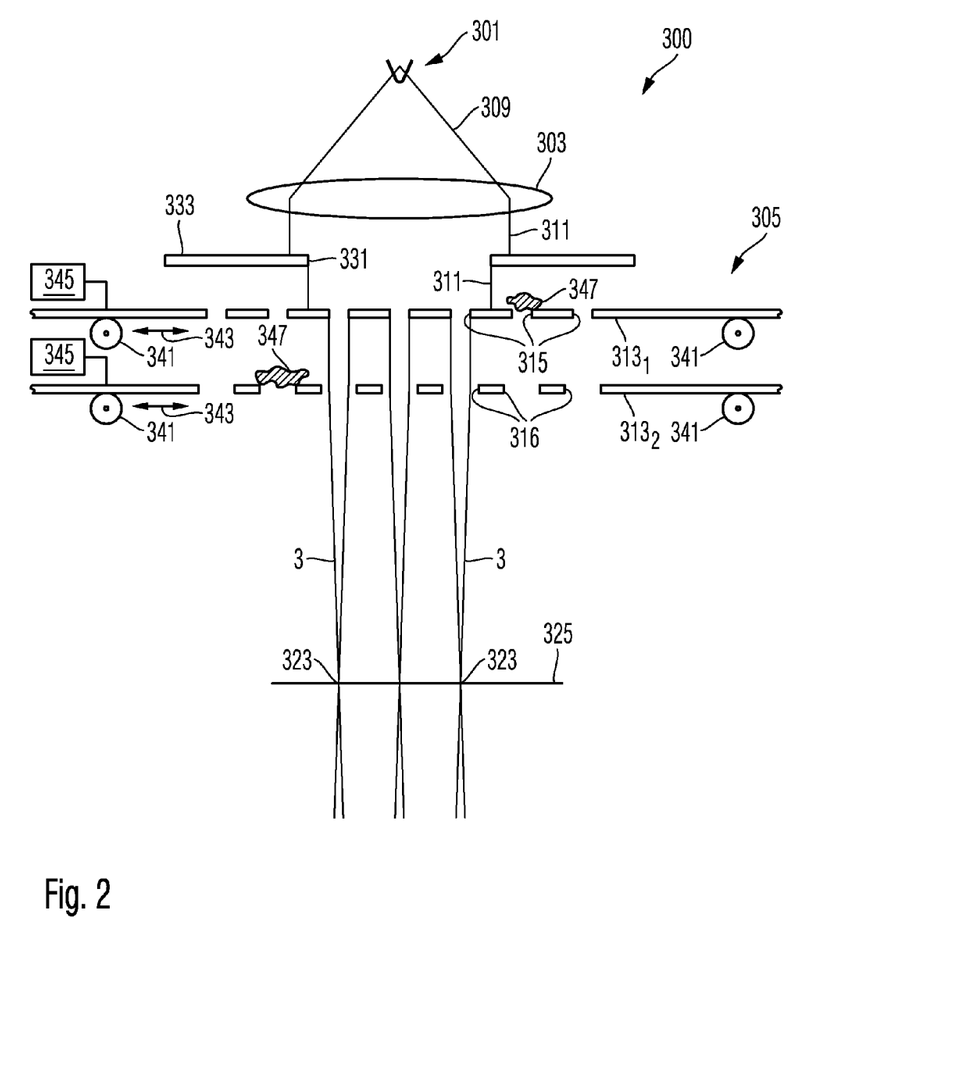
FIG. 2 schematically illustrates a portion of a beam generator according to a first embodiment which can be used in the system shown in FIG. 1.

FIG. 2 is a schematic illustration of a beam generator 300 which can be used in the system illustrated with reference to FIG. 1 above. The beam generator 300 comprises a charged particle beam source 301 generating a divergent particle beam 309 which is formed to a parallel beam 311 by a condenser lens 303. The beam 311 traverses a beam limiting aperture 331 provided in an aperture plate 333 and is incident on a first multi-aperture plate $313_1$ of a multi-aperture arrangement 305. The first multi-aperture plate $313_1$ has a function of a beam divider. For this purpose, the multi-aperture plate $313_1$ has an array of apertures 315 such that particles traversing the apertures 315 form an array of charged particle beams 3 downstream of the multi-aperture plate $313_1$. FIG. 2 shows a number of only three beams arranged along a linear line for illustration purposes. In practice, the number of beams can be greater, and the beams can be arranged in a two-dimensional array as mentioned above.

The multi-aperture arrangement 305 comprises a second multi-aperture plate $313_2$ positioned at a distance downstream of the first multi-aperture plate $313_1$ and having a plurality of apertures 316 aligned with the apertures 315 of the first multi-aperture plate $313_1$ such that each beam 3 formed downstream of the first multi-aperture plate $313_1$ traverses a corresponding aperture 316 of the second multi-aperture plate $313_2$.

The apertures 316 of the second multi-aperture plate $313_2$ have a diameter greater than the diameter of the apertures 315 of the first multi-aperture plate $313_1$ such that no electrons of the beams 3 are incident on the second multi-aperture plate $313_2$.

The second multi-aperture plate $313_2$ has a function of providing a particle optical lens to each beam 3 such that the beams 3 are converging beams downstream of the second multi-aperture plate $313_2$. For this purpose, suitable voltages can be applied to the first and second multi-aperture plates $313_1$, $313_2$ by a controller (not shown in FIG. 2) of the particle optical system. The converging beams 3 form beam foci 323 in a plane 325.

The first and second multi-aperture plates $313_1$, $313_2$ are each mounted on a linear-motion bearing allowing a lateral displacement of the multi-aperture plates $313_1$, $313_2$ in a direction transverse to the incident beam 311, as indicated by arrows 343 in FIG. 2.

The multi-aperture arrangement 305 further comprises two actuators 345 to adjust the displacement positions of each of the multi-aperture plates $313_1$, $313_2$.

The number of apertures 315 provided in each of the multi-aperture plates $313_1$, $313_2$ is significantly greater than the number of primary charged particle beams 3 used for producing beam spots on an object plane 101 (see FIG. 1) and imaged onto detection elements 215 (see FIG. 1). Only a portion of the total number of apertures 315, or only a group of the apertures 315, of the multi-aperture plates are used for generating primary charged particle beams 3 producing beam spots imaged onto detection elements, accordingly. By operating the actuators 345, it is possible to laterally displace the multi-aperture plates $313_1$, $313_2$ and to selectively change the groups of apertures which are used to generate the primary charged particle beams producing beam spots imaged onto the detection elements.

This configuration has the following advantages: it may happen that one or more apertures 315 of the multi-aperture plates $313_1$, $313_2$ are clogged by a particle 347 such that these apertures may not be traversed by particles and that a corresponding primary charged particle beam is not generated downstream of the clogged aperture. In such situation, it is possible to laterally displace the multi-aperture plate $313_1$, $313_2$ such that a group of apertures having no deficiencies is positioned within the trajectories of the particles of the incident beam 311, allowing to generate the full number of primary charged particle beams 3 producing beam spots imaged onto detection elements.

Moreover, the geometries and properties of the apertures 315 formed in the multi-aperture plates $313_1$, $313_2$ may vary due to limitations in the manufacturing process or due to contaminations and deposition of materials at the peripheries of the apertures during operation. It is then possible to identify a group of apertures within each multi-aperture plate which provides a best performance of the system and to displace the multi-aperture plates such that this group of apertures is located within the trajectories of the particles of the incident beam 311.

Figure 3:
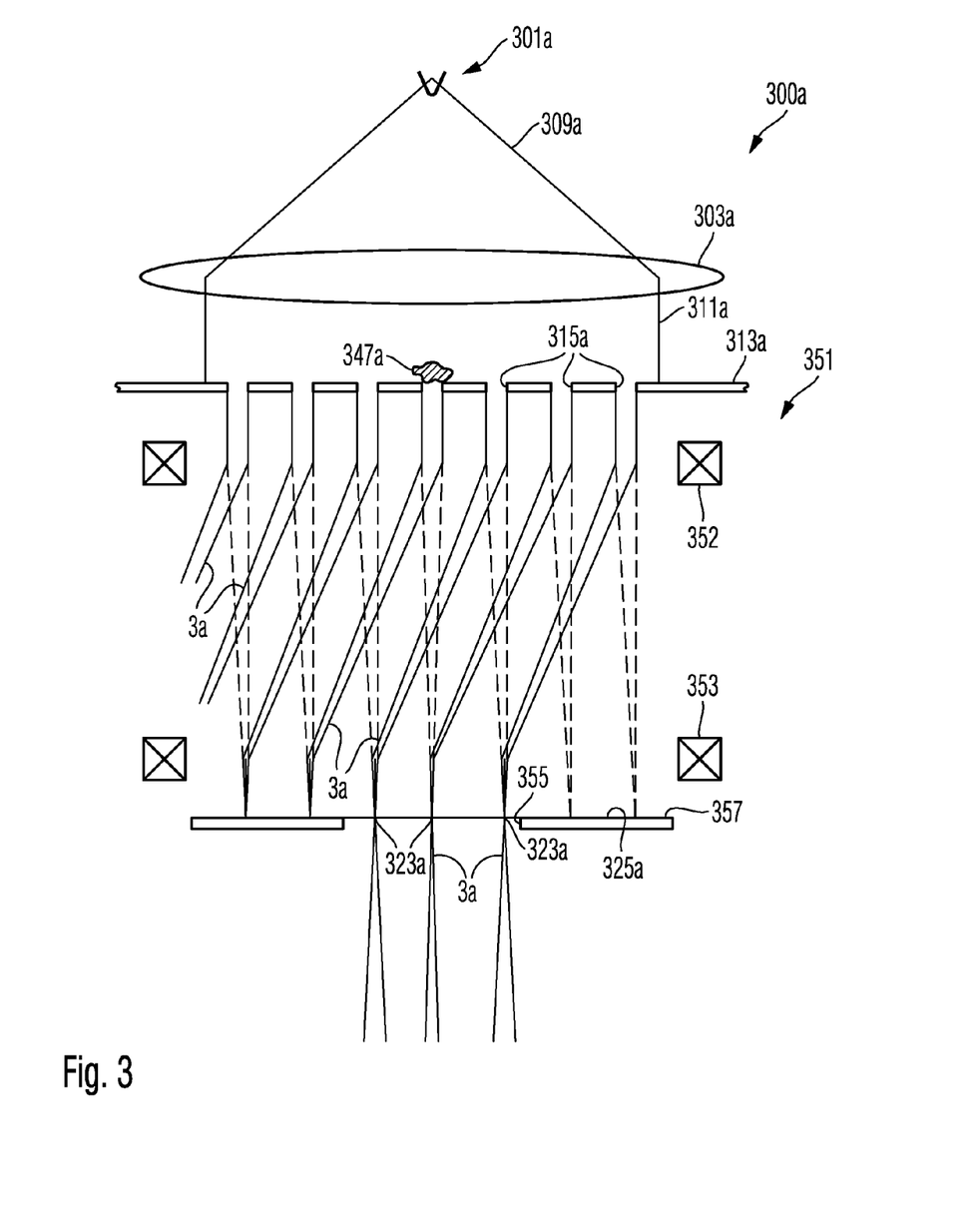
FIG. 3 schematically illustrates a portion of a beam generator according to a second embodiment which can be used in the system shown in FIG. 1.

FIG. 3 is a schematic illustration of a further beam generator 300a allowing to select a group of apertures 315a of a multi-aperture plate 313a for generating plural primary charged particle beams producing beam spots in an object plane which are imaged onto detection elements of a charged particle multi-beam inspection system.

The beam generator 300a comprises a charged particle source 301a generating a divergent particle beam 309a formed into a parallel beam 311a by a condenser lens 303a. The parallel beam 311a is incident on the multi-aperture plate 313a having a plurality of apertures 315a formed therein. The number of apertures 315a formed in the multi-aperture plate 313a is substantially greater than the number of primary charged particle beams 3a used for generating beam spots imaged onto detection elements. While it was possible to laterally displace the multi-aperture plates relative to the incident beam in the example illustrated with reference to FIG. 2 above, this is not possible with the multi-aperture plate 313a. Moreover, the incident beam 311a illuminates all apertures 315a of the multi-aperture plate 313a while the incident beam of the example illustrated with reference to FIG. 2 above illuminates only a smaller group of apertures.

The beam generator 300a further comprises a beam bidirectional deflector 351 including a first deflection element 352 positioned downstream of the multi-aperture plate 313a and a second deflection element 353 positioned downstream of the first deflection element 352. Both deflection elements 352 are configured to commonly deflect all of the beams 3a formed downstream of the multi-aperture plate 313a. The undeflected beams are indicated in broken lines in FIG. 3. A particle 347a which clogs the central aperture 315a of the multi-aperture plate 313a is shown in FIG. 3. If the beams were not deflected, the central beam of the three beams 3a used for generating beam spots imaged onto detection elements would be blocked, accordingly. Therefore, the deflection elements 352 and 353 of the charged particle beam deflector 351 are energized by a controller (not shown in FIG. 3) such that a group of apertures 315a having no defect generates the beams 3a which can traverse an aperture 355 formed in a plate 357 positioned downstream of the first deflection element 352 or downstream of the second deflection element 353. The beams 3a traversing the aperture 355 can reach the object in order to form beam spots imaged onto detection elements. The other beams 3a are intercepted by the plate 357 or do not even reach this plate.

Figure 4:
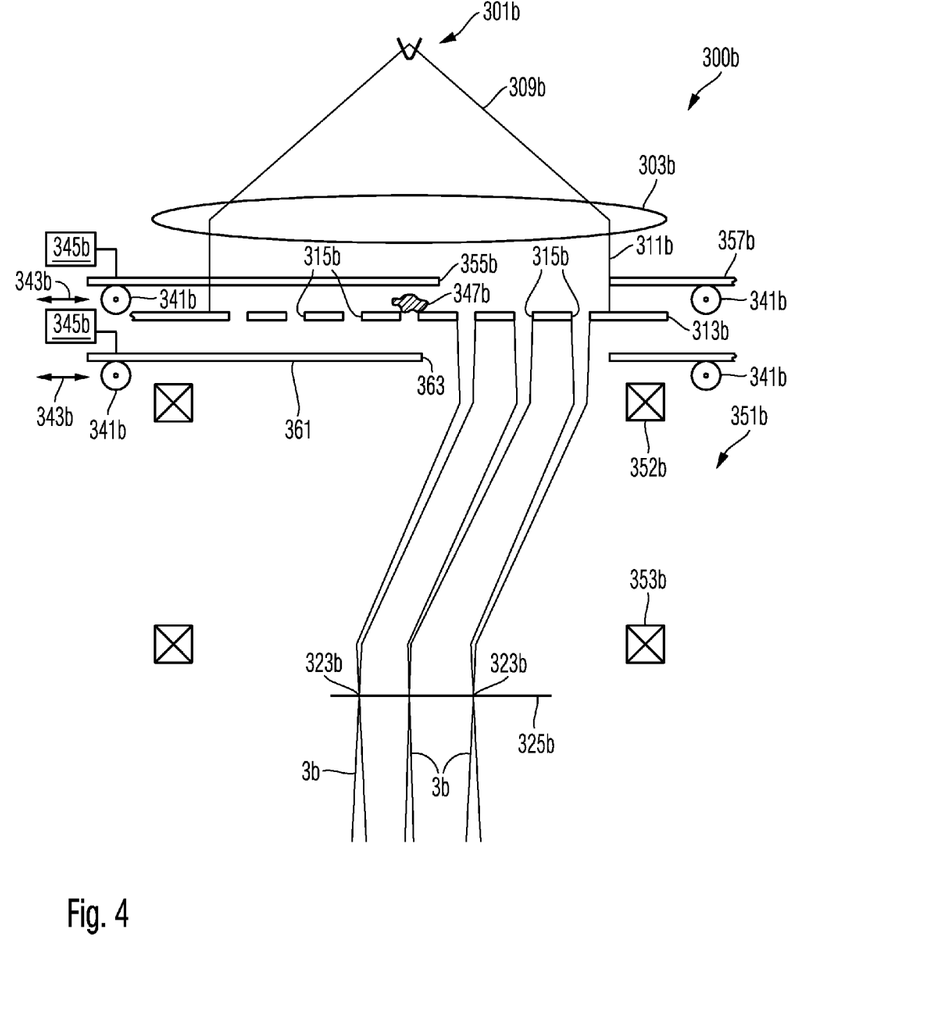
FIG. 4 schematically illustrates a portion of a beam generator according to a third embodiment which can be used in the system shown in FIG. 1.

FIG. 4 is an illustration of a beam generator 300b having a configuration similar to the beam generator illustrated with reference to FIG. 3 above. In particular, a charged particle source 301b generates a divergent beam 309b which is collimated into a parallel beam 311b by a condenser lens 303b. A multi-aperture plate 313b has a number of apertures 315b which is significantly greater than a number of beams 3b directed to an object in order to form beam spots imaged onto detection elements.

While the example illustrated with reference to FIG. 3 above uses a plate 357 positioned downstream of the beam deflector 351 to intercept beams which are not intended to reach the object, the beam generator 300b of FIG. 4 has a corresponding aperture plate 357b having an aperture 355b positioned upstream of the multi-aperture plate 313b in the parallel beam 311b. The aperture 355b has a diameter which is smaller than a diameter of the parallel beam 311b and smaller than a diameter of the regions of the multi-aperture plate 313b where the apertures are formed. The aperture 355b allows only those particles to traverse the aperture 355b which are intended to form the beams 3b reaching the object for generating beam spots imaged onto the detection elements. The aperture plate 357b is mounted on a linear-motion bearing 341b allowing to laterally displace the aperture plate 357b such that it can be aligned with the selected group of apertures 315b traversed by the beams 3b intended to reach the object for forming beam spots imaged onto the detection elements. The displacement position of the aperture plate 357b is defined by an actuator 345b controlled by the controller which also controls deflection elements 352b and 353b of a beam deflector 351b.

Since the aperture plate 357b is positioned upstream of the multi-aperture plate 313b, particles of the parallel beam 311b are intercepted which would otherwise be incident on the apertures 315b of the multi-aperture plate 313b and do not contribute to the beams forming beam spots imaged onto the detection elements. This may have an advantage in reducing heat load on the multi-aperture plate or in reducing an electron dose incident on the multi-aperture plate, which will reduce contamination. However, the plate 357b can also be positioned downstream of the multi-aperture plate 313b in order to intercept particles forming unnecessary beams. Moreover, the plate 357b may include plural apertures of different shapes and sizes to select different groups of beamlets having different numbers and arrangements of the beamlets.

The beam generator 300b further comprises a plate 361 having an aperture 363 positioned at a distance downstream from the multi-aperture plate 313b. Electrical voltages applied to the multi-aperture plate 313b and the plate 361 determine a focusing power of particle optical lenses provided by the apertures 315b such that foci 323b of the beams 3b are formed in a plane 325b downstream of the multi-aperture plate. Also the plate 361 is mounted on a linear-motion bearing 341b to be laterally displaceable in a direction indicated by an arrow 343b in FIG. 4, wherein the lateral position of the plate 361 is defined by an actuator 345b controlled by the controller of the system. The plate 361 is displaced such that the array of beams 3b reaching the object for forming beam spots imaged onto detection elements is centered relative to the aperture 363 of the plate 361.

A method of operating a charged particle multi-beam inspection system will be illustrated with reference to FIG. 5 below. The system can simultaneously direct a plurality of primary charged particle beams onto an object such that an array of beam spots is produced on the object. The system is configured to displace the array of beam spots relative to the object.

The method comprises a first recording operation in which each beam spot of the array of beam spots is maintained at a respective location on the object for a predetermined duration, and electrons originating from the beam spots are detected.

Figure 5:
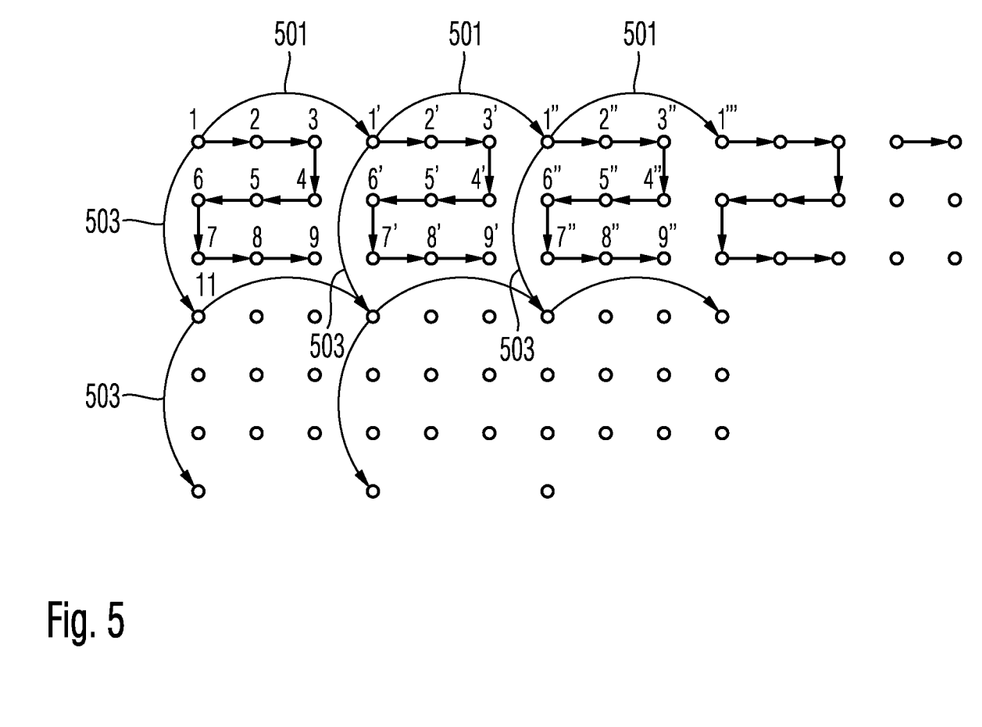
FIG. 5 schematically illustrates a scanning strategy according to a first embodiment which can be used in operating the system shown in FIG. 1.

FIG. 5 is an elevational view of the object, and circles in FIG. 5 indicate those locations on the object at which the beams are directed and maintained to form beam spots from which electrons are detected. These locations on the object are arranged in a rectangular array, and accumulated amounts of detected electrons originating from these locations can determine intensities of pixels of an electron microscopic image of the object produced from the detected electrons.

The illustrated example assumes that a linear array of three beams is used for scanning the object. The object is positioned relative to the inspection system such that the first beam is incident on location 5, the second beam is incident on location 5' and the third beam is incident on location 5", if the beams are not deflected by beam deflectors of the inspection system.

The beams can be commonly deflected by the beam deflectors of the system such that the first beam can be directed to each of the locations 1, 2, . . . , 9, the second beam can be directed to each of the locations 1', 2', . . . , 9', and the third beam can be directed to each of the locations 1", 2", . . . , 9". Thus, the three beams together can cover a field on the object including the 27 locations 1, 2, . . . , 9, 1', 2', . . . , 9', 1", 2", . . . , 9", and each individual beam can cover a subfield including nine locations, i.e. the first beam covers a first subfield including the locations 1, 2, . . . , 9, the second beam covers a second subfield including the locations 1', 2', . . . , 9', and the third beam covers a third subfield including the locations 1", 2", . . . , 9".

The number of three beams and the number of nine locations per subfield is a low number used for ease of illustration in the present example. In practice, the number of beams can be higher, the beams can be arranged in a two-dimensional rectangular or hexagonal array, and the number of locations per subfield can also be significantly higher. Moreover, the advance operation can be different from the advance operation shown in FIG. 5 and may include any permutation of the order of the beam positions.

As mentioned above, the method includes the first recording operation in which the three beam spots are maintained at three different locations on the object and in which electrons originating from the beam spots are detected. The method further comprises a first advance operation in which the array of beam spots is displaced relative to the object from a initial position to a next position such that the next position is displaced from the initial position by a first distance. The first advance operations are indicated in FIG. 5 by arrows connecting immediately adjacent locations on the object.

The method further comprises a second recording operation in which a sequence is repeatedly performed wherein the sequence includes the first recording operation and the first advance operation such that each beam spot is maintained at each of plural different locations on the object for the predetermined duration. This second recording operation is indicated in FIG. 5 by the sequence of arrows connecting the locations 1, 2, . . . to 9, connecting the locations 1', 2', . . . to 9' and connecting the locations 1", 2", . . . to 9". In this second recording operation, each of the three subfields is scanned with one of the three beams.

The method further comprises a second advance operation in which the array of beam spots is displaced relative to the object from an initial position to a next position such that the next position is displaced from the initial position by a second distance which is greater than the first distance. In the illustrated example, the second advance operation is performed by displacing the object relative to the system to the left in FIG. 5 by a distance which is equal to three times the distance between adjacent locations of the array of locations on the object. The second advance operation is indicated in FIG. 5 by arrows 501. In the illustrated example, the second distance corresponds to the distance between adjacent subfields, or the second distance corresponds to the distance between adjacent electron beams.

The method further comprises a third recording operation in which a sequence is repeatedly performed, wherein the sequence includes the second recording operation and the second advance operation such that plural different beam spots are maintained at each of the plural different locations on the object for the predetermined duration. In particular, after performing of the second recording operation as illustrated above, the second advance operation 501 is performed, and the second recording operation is performed again such that the subfield with locations 1', 2' . . . , 9', which has been previously scanned using the second beam, is now scanned again using the first beam, and the third subfield with locations 1", 2", . . . , 9", which has been previously scanned using the third beam, is now again scanned using the second beam. The third beam will then scan a subfield with locations 1'", . . . which has not been scanned before. Thereafter, a further second advance operation 501 is performed, and a second recording operation is performed again, such that the third subfield 1", 2", . . . , 9", which has been previously scanned using the third and second beams, is now again scanned using the first beam. This process is repeated until the right edge of the area of the object to be inspected is reached. Thereafter, the object is moved relative to the system such that the location 11 on the object is positioned relative to the system at the same position where the location 1 is positioned at the beginning of the illustrated procedure. This advance operation is indicated by arrows 503 in FIG. 5. Thereafter, the third recording operation with second advance operations 501 is repeatedly performed until the right edge of the inspected area is reached again and the process with advance operations 503 is repeated until the bottom edge of the inspected area is reached. Thereafter, the scanning of the inspected area is completed.

It is apparent that, apart from subfields located close to the edge of the inspected area, all subfields are scanned plural times, in particular three times, each time with a different beam. Therefore, electrons detected for each location on the object originate from plural different beams, in particular three different beams, and the detected electron amounts originating from the plural, in particular three, different beams can be accumulated for each location on the object.

If the plural beams differ with respect to their beam current or focusing properties, the accumulation provides an averaging which is the same for all locations on the object, and differences between beam currents and other properties of the beams do less affect the final result, such as an electron microscopic image of the object.

Moreover, if one of the beams has a severe deficiency, such that it is, for example, blocked and does not reach the object, the detection of electrons corresponding to the deficient beam can be ignored in the first recording operation and can be excluded from the accumulation of detected electron intensities. Thus, even if one of the plural beams is blocked, each location on the object is still scanned two times such that all locations on the object may contribute to a generated electron microscopic image.

In the above example, the first distance, by which the next position is displaced relative to the first position in the first advance operation is equal to the distance between adjacent locations of the array of locations on the object. The distance by which the next position is displaced relative to the initial position in the second advance operation 501 is substantially greater than the first distance. In the illustrated example, this distance is three times the first distance, i.e. an integer multiple of the first distance. In the illustrated example, the this distance corresponds to the distance between adjacent subfields, or, this distance corresponds to the distance between adjacent beams.

Moreover, the beam spots of the array of beam spots are spaced apart by a third distance three times greater than the first distance. Also, the array of beam spots in the above example has a lateral extension which is six times the first distance and greater than the second distance. Further, in the above example, the array of beams has a lateral extension which is two times the distance between adjacent subfields, or the array of beams has a lateral extension which is two times the distance between adjacent beams.

A further example of a method of operating a charged particle multi-beam inspection system will be illustrated with reference to FIGS. 6 and 7 below.

Figure 6:
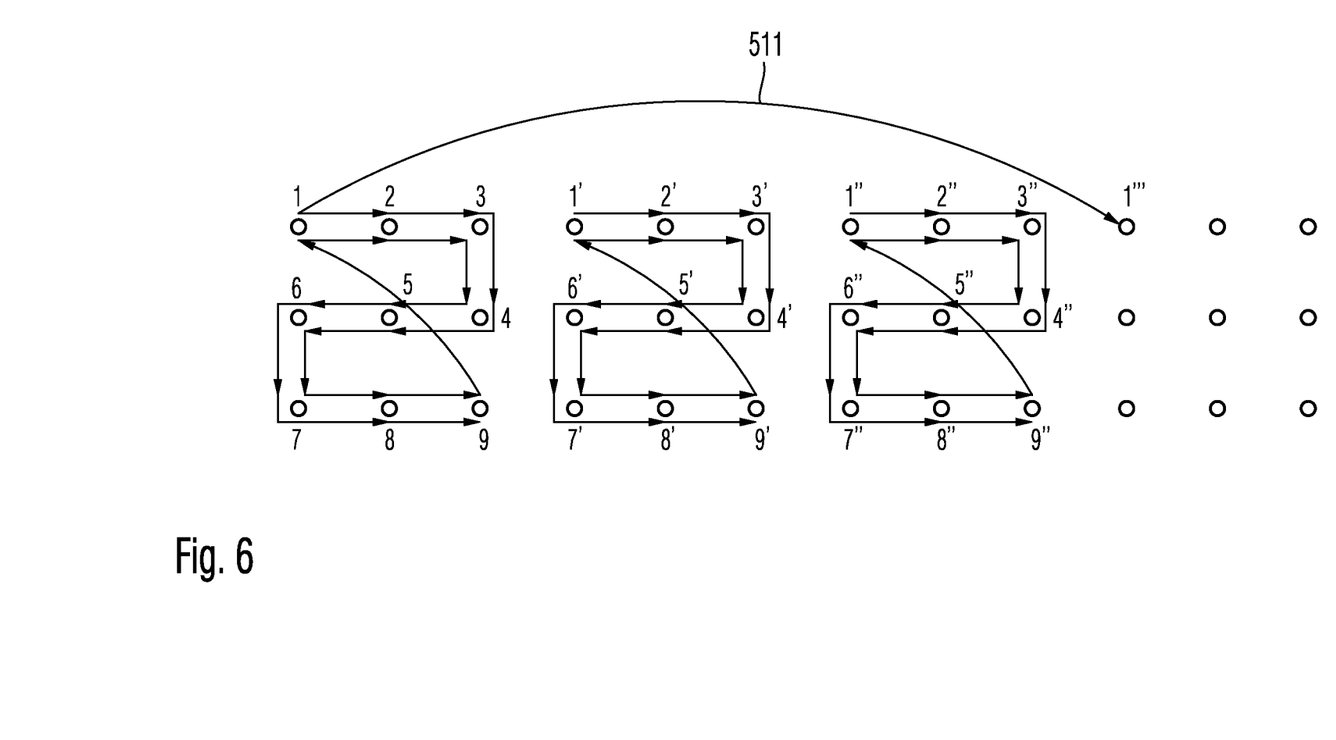
FIG. 6 schematically illustrates a scanning strategy according to a second embodiment which can be used in operating the system shown in FIG. 1.

FIG. 6 is an elevational view on the object similar to FIG. 5. Again, circles indicate an array of locations on the object to which particle beams are directed and maintained for detecting electrons in a first recording operation. Again, for illustration purposes, a low number of three beams are used in the system to scan the object, and the corresponding subfields contain a low number of nine locations on the object. As mentioned above, the number of beams and the number of locations per subfield can be higher.

The method further comprises a first advance operation indicated, similar to FIG. 5, by arrows connecting directly adjacent locations on the object.

The method further comprises a second recording operation in which a sequence is repeatedly performed which includes the first recording operation and the first advance operation in order to scan a subfield with one beam as illustrated with reference to FIG. 5 above.

The present example differs from the method illustrated with reference to FIG. 5 above in that a third recording operation includes repeatedly performing a sequence of the second recording operation and collectively changing the focus positions of the beams such that each beam spot is repeatedly maintained at a given location on the object for the predetermined duration.

The system is designed such that the primary charged particle beams have a focus on the object such that the produced beam spots have a size which is as small as possible. This configuration promises a resolution of the system which is as high as possible. However, in practice, it may be not possible that the beam foci of all primary charged particle beams are simultaneously arranged exactly on the object. Some beam foci are formed upstream of the object, and some other beam foci are formed downstream of the object. This results in beam spot sizes which vary between the different beams. This can in particular happen, when the object surface is not perfectly flat.

Figure 7:
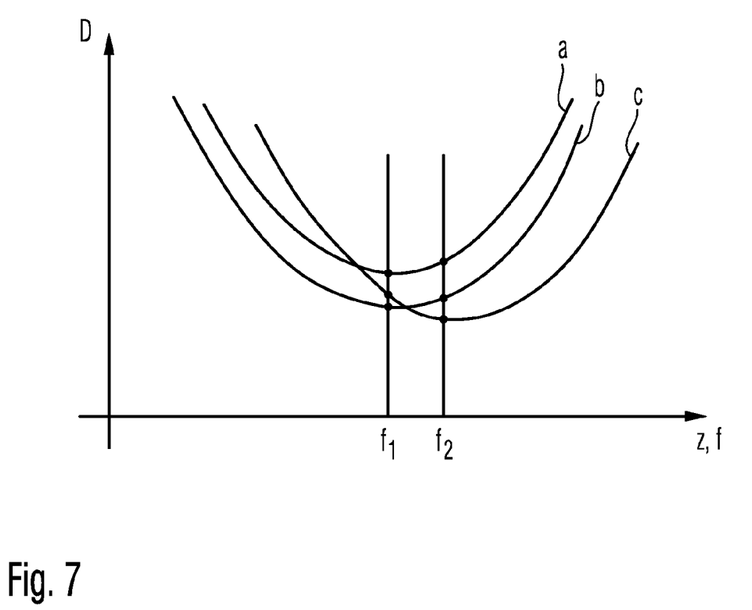
FIG. 7 illustrates focus positions of particle beams which may occur in the method illustrated with reference to FIG. 6.

FIG. 7 is a graph illustrating beam spot sizes D which can be achieved by three beams a, b, c in an exemplary system in dependence of a position of the object along the beam direction z. It is apparent that there is no single z-position of the object in which all beams achieve the minimum spot size and that even the minimum achievable spot sizes differ between beams.

Apart from changing the position of the object in the z-direction for changing the focusing state of the beams on the object, it is similarly possible to collectively change the focusing positions by differently energizing a focusing lens provided in the beam path of the primary charged particle beams. Thus, the graph shown in FIG. 7 can also have the focusing power f of this lens as the abscissa.

In the example of FIG. 6, each subfield is scanned two times, wherein the first scanning of the subfield is performed with a setting f1 (see FIG. 7) of the focus positions. Thereafter, the focus positions are changed to a setting f2 (see FIG. 7), and the subfield is scanned again. This results in an averaging of the focus positions such that differences between focusing properties of the individual beams affect the eventually achievable resolution to a lesser extend.

In the illustrated example, each subfield is scanned two times at two different settings of the focus positions. However, it is possible to provide a higher number of different settings of the focus positions and to scan the subfields the higher number of times.

The method further comprises a second advance operation indicated by arrow 511 in FIG. 6 in which the object is displaced relative to the system by an amount corresponding to the lateral extension of the field consisting of the three subfields. After performing of the second advance operation, the procedure illustrated above is repeated.

In other examples, the second advance operation 511 moves the object relative to the system by a smaller distance. For example, the smaller distance can be equal to the lateral extension of the subfield such that the advantages of the method illustrated with reference to FIG. 6 are combined with the advantages of the method illustrated with reference to FIG. 5.

In the methods illustrated with reference to FIGS. 5 to 7, the first advance operation is performed to move a beam from one location on the object to the next immediately adjacent location is performed by operating a beam deflector of the system, while the other advance operations are performed by displacing the object relative to the system. It is, however, also possible, to achieve a same operation of the method with respect to the scanning strategy by continuously moving the object relative to the system and compensating this continuous movement by corresponding deflections of the array of primary charged particle beams.

It should be noted that it is not necessary that the electron beams are directly moved from one position to the next position as indicated by the arrows shown in FIGS. 5 and 6. Instead it is also possible to apply more sophisticated scanning methods in which the electron is directed to the individual position in a different order incurring, for example, long distant jumps in one direction and subsequent jumps in the reverse direction to positions which have been skipped by the long distance jumps.

In a further alternative scanning method, each sub-field can be further divided into sub-blocks, and only non-adjacent sub-blocks are scanned directly one after the other and skipping non-scanned sub-blocks there between. The skipped sub-blocks can be scanned at a later time. Such methods can be advantageous, for example, when objects are inspected which strongly accumulate surface charges during the scanning.

Moreover, the above principles are not limited to embodiments where the detected electrons are emitted from the object in a direction opposite to the direction of incidence of the particles generating the beam spots. In other embodiments, the detected electrons are emitted from the object in the direction of the incident beams generating the beam spots. The detected electron may then include electrons transmitted through the object, when the incident particles generating the beam spots are electrons.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

The invention claimed is:

1. A charged particle multi-beam inspection system, comprising:
    a beam generator configured to generate a plurality of primary charged particle beams and to direct the plurality of primary charged particle beams onto an object plane such that an array of beam spots is produced on the object plane;
    an array of a first number of detection elements configured to generate detection signals upon incidence of electrons on the detection elements;
    charged particle imaging optics configured to image the array of beam spots onto the array of detection elements such that electrons generated by the primary charged particle beams at each beam spot are directed onto a corresponding detection element;
    wherein the beam generator includes a multi-aperture plate having an array of a second number of apertures;
    wherein the second number is greater than the first number;
    wherein the beam generator is configured such that the apertures of a group of apertures are each traversed by one primary charged particle beam producing a beam spot which is imaged onto one of the detection elements, wherein a number of the apertures of the group of apertures is equal to the first number;
    wherein the beam generator includes a selector having plural different states, wherein, in each of the plural different states, the apertures of a different group of apertures are each traversed by one primary charged particle beam producing a beam spot which is imaged onto one of the detection elements, wherein a number of the apertures of the different group of apertures is equal to the first number.

2. The charged particle multi-beam inspection system according to claim 1, wherein the selector comprises a first actuator configured to laterally displace the multi-aperture plate between plural different positions such that, in each of the plural different states, the multi-aperture plate is in a different position.

3. The charged particle multi-beam inspection system according to claim 1, wherein the selector comprises a charged particle beam deflector and a controller configured to energize the charged particle beam deflector and to adjust plural different deflection amounts provided by the charged particle beam deflector such that, in each of the plural different states, a different deflection amount is adjusted.

4. The charged particle multi-beam inspection system according to claim 3, wherein the selector comprises a plate having an aperture traversed by particles of all beams directed onto the object, and a second actuator configured to laterally displace the plate between plural different positions.

5. A method of operating the charged particle multi-beam inspection system of claim 1, the method comprising:

setting the selector to a first state in which the apertures of a first group of a number of apertures, the number of apertures equal to the first number, are each traversed by one primary charged particle beam producing a beam spot which is imaged onto one of the detection element;

determining that at least one aperture of the apertures of the first group of apertures has a deficiency; and setting the selector to a second state in which the apertures of a second group of the second number of apertures are each traversed by one primary charged particle beam producing a beam spot which is imaged onto one of the detection element, wherein the first group of apertures is different from the second group of apertures.

* * * * *